(12) United States Patent
Kim et al.

(10) Patent No.: US 10,036,186 B2
(45) Date of Patent: Jul. 31, 2018

(54) ELECTRONIC DEVICE AND MAGNETIC CONNECTION THEREOF

(71) Applicants: Samsung Electronics Co., Ltd., Gyeonggi-do (KR); DAEHAN SPECIAL METAL CO., LTD, Incheon (KR)

(72) Inventors: Heeyoung Kim, Seoul (KR); Sungyeon Lee, Gyeonggi-do (KR); Hyoungsu Kim, Incheon (KR); Joon Beom An, Incheon (KR)

(73) Assignee: Daehan Special Metal Ind Co., Ltd (KR)

( * ) Notice: Subject to any disclaimer, the term of this patent is extended or adjusted under 35 U.S.C. 154(b) by 72 days.

(21) Appl. No.: 15/214,157

(22) Filed: Jul. 19, 2016

(65) Prior Publication Data
US 2017/0138101 A1 May 18, 2017

(30) Foreign Application Priority Data
Nov. 18, 2015 (KR) .......................... 10-2015-0161844

(51) Int. Cl.
| | |
|---|---|
| E05D 1/06 | (2006.01) |
| E05D 1/04 | (2006.01) |
| E05D 7/10 | (2006.01) |
| E05D 11/10 | (2006.01) |
| H05K 5/00 | (2006.01) |
| H05K 5/02 | (2006.01) |

(52) U.S. Cl.
CPC .................. *E05D 1/06* (2013.01); *E05D 1/04* (2013.01); *E05D 7/10* (2013.01); *E05D 11/1014* (2013.01); *H05K 5/0021* (2013.01); *H05K 5/0226* (2013.01); *E05Y 2900/606* (2013.01)

(58) Field of Classification Search
CPC .... E05D 1/06; E05D 1/04; E05D 7/10; E05D 11/1014; H05K 5/0226; H05K 5/0021; E05Y 2900/606; H01R 13/6205
See application file for complete search history.

(56) References Cited

U.S. PATENT DOCUMENTS

| | | | |
|---|---|---|---|
| 8,498,100 B1 * | 7/2013 | Whitt, III | G06F 1/1618 |
| | | | 361/679.17 |
| 9,774,136 B2 * | 9/2017 | Szeto | H01R 13/22 |

(Continued)

FOREIGN PATENT DOCUMENTS

| | | |
|---|---|---|
| KR | 20-0269980 | 3/2002 |
| KR | 10-2003-0016990 | 3/2003 |

(Continued)

*Primary Examiner* — Steven T Sawyer
*Assistant Examiner* — Sagar Shrestha
(74) *Attorney, Agent, or Firm* — The Farrell Law Firm, P.C.

(57) ABSTRACT

An electronic device provided. The electronic device includes a first body part including a first connection member and a second body part including a second connection member. At least one of the first connection member and the second connection member includes and a portion having a first flat area and a second area. The second area having a generally curved configuration and extending from the first flat area for magnetically coupling the first body part and the second body part to each other.

18 Claims, 16 Drawing Sheets

(56) References Cited

U.S. PATENT DOCUMENTS

| | | | |
|---|---|---|---|
| 2005/0239261 A1* | 10/2005 | Tai | H01R 13/6205 438/380 |
| 2007/0133156 A1* | 6/2007 | Ligtenberg | G06F 1/1616 361/679.27 |
| 2008/0158800 A1* | 7/2008 | Aoyagi | G06F 1/1616 361/679.01 |
| 2010/0058557 A1* | 3/2010 | Wang | G06F 1/1616 16/320 |
| 2012/0194448 A1 | 8/2012 | Rothkopf | |
| 2013/0063873 A1* | 3/2013 | Wodrich | G06F 1/1635 361/679.01 |
| 2014/0273546 A1* | 9/2014 | Harmon | H01R 13/6205 439/39 |
| 2017/0257146 A1* | 9/2017 | Szeto | H04B 5/0075 |
| 2017/0310042 A1* | 10/2017 | Michelmann | H01R 13/6205 |

FOREIGN PATENT DOCUMENTS

| | | |
|---|---|---|
| KR | 10-2009-0077644 | 7/2009 |
| KR | 10-2010-0125968 | 12/2010 |
| KR | 10-2013-0121968 | 11/2013 |

* cited by examiner

ELECTRONIC DEVICE AND MAGNETIC CONNECTION THEREOF

PRIORITY

This application claims priority under 35 U.S.C. § 119(a) to Korean Patent Application Serial No. 10-2015-0161844, which was filed in the Korean Intellectual Property Office on Nov. 18, 2015, the entire content of which is incorporated herein by reference.

BACKGROUND

1. Field of the Disclosure

The present disclosure relates generally to an electronic device, and more particularly, to an electronic device including first and second body parts that are connected by a magnet.

2. Description of the Related Art

A conventional electronic device can include a first body part and a second body part that are foldable with respect to one another via a hinge. The first body part may include a coupling protrusion that is formed on a surface thereof and that is configured to engage a corresponding coupling groove that is recessed on a surface of the second body. To assemble the electronic device, the hinge is inserted through a fastening hole that passes through the coupling protrusion and coupling groove for coupling the first body part to the second body part so that first body part and the second body are foldable with respect to one another about the hinge.

In certain instances, the first body part and the second body part may include an insertion structure, e.g., a connection terminal for providing electrical communication with another insertion structure, that is configured to connect to a connection cable that includes its own insertion structure. The insertion structure of the first body part and/or the second body part may be disposed within a groove of the first body part and/or the second body part.

During operation of the electronic device, the first body part and the second body part may be repeatedly opened and closed with respect to each other, which may cause a connection between the groove and the insertion structure of the connector to become loose. Further, opening and closing of the first body part and the second body part may damage or destroy the connection terminal.

SUMMARY

Aspects of the present disclosure have been made to address at least the above-mentioned problems and/or disadvantages and to provide at least the advantages described below.

In accordance with an aspect of the present disclosure, there is provided an electronic device. The electronic device includes a first body part including a first connection member and a second body part including a second connection member. At least one of the first connection member and the second connection member includes and a portion having a first flat area and a second area. The second area having a generally curved configuration and extending from the first flat area for magnetically coupling the first body part and the second body part to each other.

BRIEF DESCRIPTION OF THE DRAWINGS

The above and other aspects, features, and advantages of certain embodiments of the present disclosure will be more apparent from the following detailed description taken in conjunction with the accompanying drawings, in which.

DETAILED DESCRIPTION

Hereinafter, a configuration of an electronic device according to various embodiments of the present disclosure will be described with reference to accompanying drawings.

Figure 1:
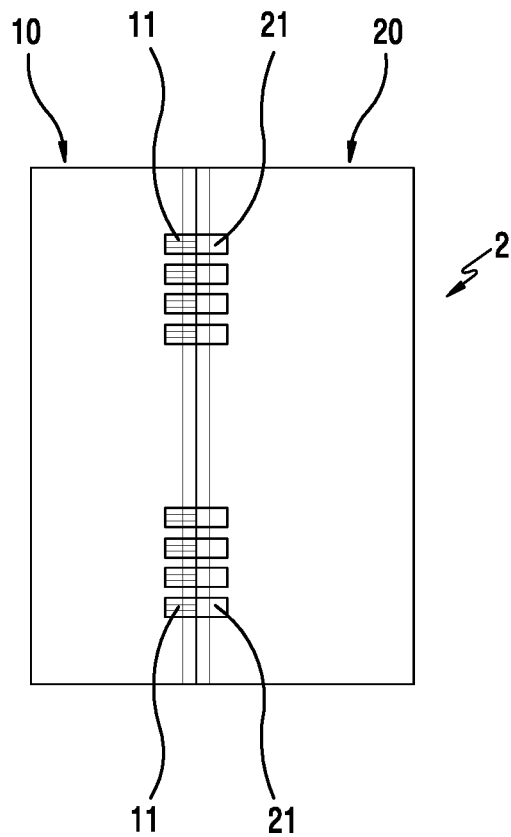
FIG. 1 is a diagram illustrating an electronic device having first and second body parts that are magnetically coupled to each other, according to an embodiment of the present disclosure.
Figure 2:
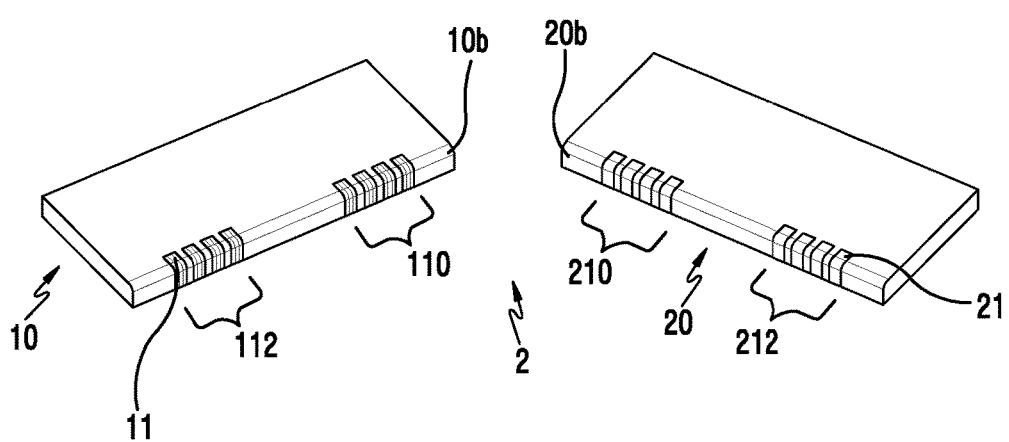
FIG. 2 is a diagram of the electronic device with the first and second body parts shown separated from each other, according to an embodiment of the present disclosure.

FIG. 1 is a diagram illustrating an electronic device 2 having first and second body parts that are magnetically coupled to each other, according to an embodiment of the present disclosure. FIG. 2 is a diagram of the electronic device 2 with the first and second body parts shown separated from each other, according to an embodiment of the present disclosure.

Referring to FIGS. 1 and 2, a first body part 10 and a second body part 20, and a pair of first and second connection members 11 and 21, respectively, which magnetically couple the first and second body parts 10 and 20 to each other, are shown. The first and second body parts 10, 20 may form a housing of the electronic device 2. A first connection member 11 is coupled to the first body part 10 and a second connection member 21 is coupled to the second body part 20. As described below, a magnetic coupling provided between the first and second connection members 11 and 21, respectively, couples the first and second body parts 10 and 20 to each other. The first and second body parts 10 and 20 may be coupled to each other using a non-insertion scheme, that is, the first and second body parts 10 and 20 may be coupled to each other in a surface-contact scheme.

The first and second connection members 11 and 21 may use a magnetic coupling using magnets having opposite polarities or by using a magnet and one or more suitable metals.

At least one or at least a pair of first connection member(s) 11 may be mounted on a first coupling surface 10b of a first coupling portion of the first body part 10. In the illustrated embodiment, four first connection members 11 are disposed at each of upper and lower portions of the first coupling surface 10b (FIG. 2). The four first connection members 11 arranged at the upper portion of the first coupling surface 10b may be referred to as a first upper connection member 110 and the four first connection members 11 arranged at the lower portion of the first coupling surface 10b may be referred to as a first lower connection member 112.

At least one or at least a pair of second connection member(s) 21 may be mounted on a second coupling surface 20b of a second coupling portion of the second body part 20. In the illustrated embodiment, four second connection members 21 may be arranged at each of upper and lower portions of the second coupling surface 20b. The four second connection members 21 arranged at the upper portion of the second coupling surface 20b may be referred to as a second upper connection member 210 and the four second connection members 21 arranged at the lower portion of the second coupling surface 20b may be referred to as a second lower connection member 212.

The first upper connection member 110 and the second upper connection member 210 and the first lower connection member 112 and the second lower connection member 212 may magnetically couple to each other so as to couple the first body part 10 to the second body part 20 so that the first body part 10 and the second body part 20 can be moved relative to each other between a folded configuration and an unfolded configuration.

The first coupling surface 10b may include a first outer peripheral surface having a first predetermined curvature and the second coupling surface 20b may include a second outer peripheral surface having a first predetermined curvature.

Figure 3A:
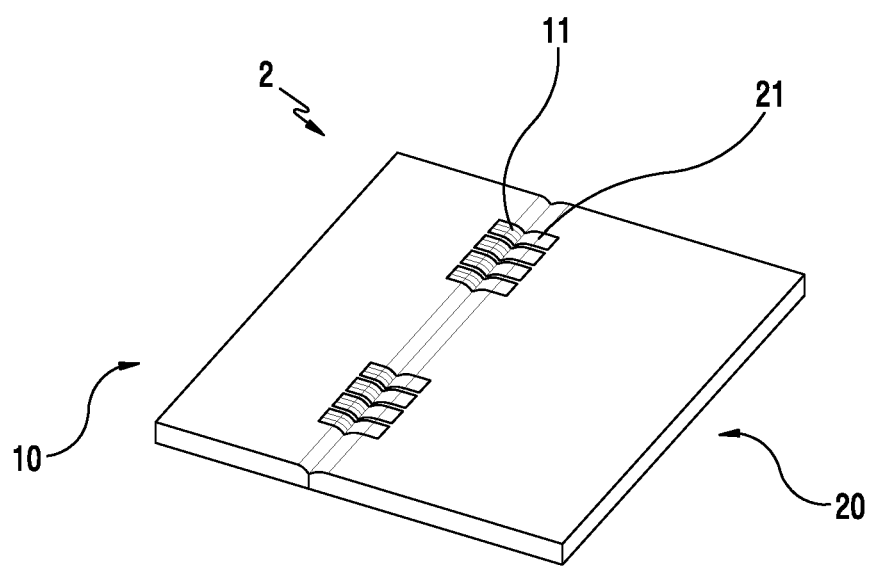
FIG. 3A is a perspective view of the electronic device illustrating the first and second body parts in an unfolded configuration, according to an embodiment of the present disclosure.
Figure 3B:
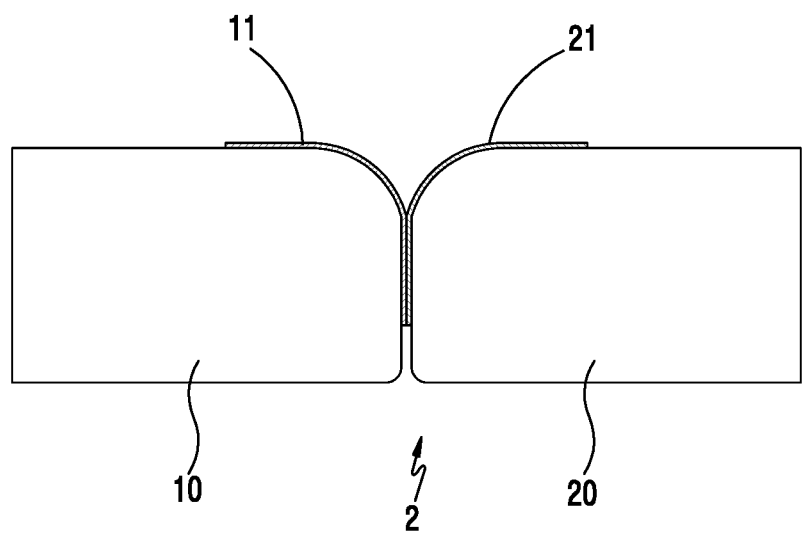
FIG. 3B is a partial, side view of the electronic device illustrating the first and second body parts in the unfolded configuration, according to an embodiment of the present disclosure.

FIG. 3A is a perspective view of the electronic 2 device illustrating the first and second body parts 10, 20 in an unfolded configuration, according to an embodiment of the present disclosure and FIG. 3B is a partial, side view of the electronic device 2 illustrating the first and second body parts 10, 20 in the unfolded configuration, according to an embodiment of the present disclosure.

Referring to FIGS. 3A and 3B, the electronic device 2 is shown in the unfolded configuration. In the unfolded configuration, the electronic device 2 can be arranged in a horizontal state on a table, etc.

Figure 4:
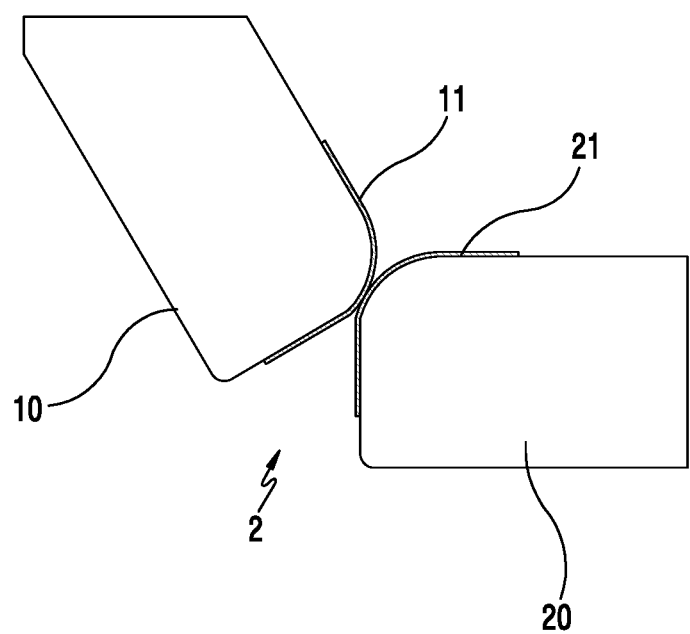
FIG. 4 is a partial, side view of the electronic device as the first and second body parts are being folded, according to an embodiment of the present disclosure.

FIG. 4 is a partial, side view of the electronic device 2 as the first and second body parts 10, 20 are being folded, according to an embodiment of the present disclosure.

Figure 5A:
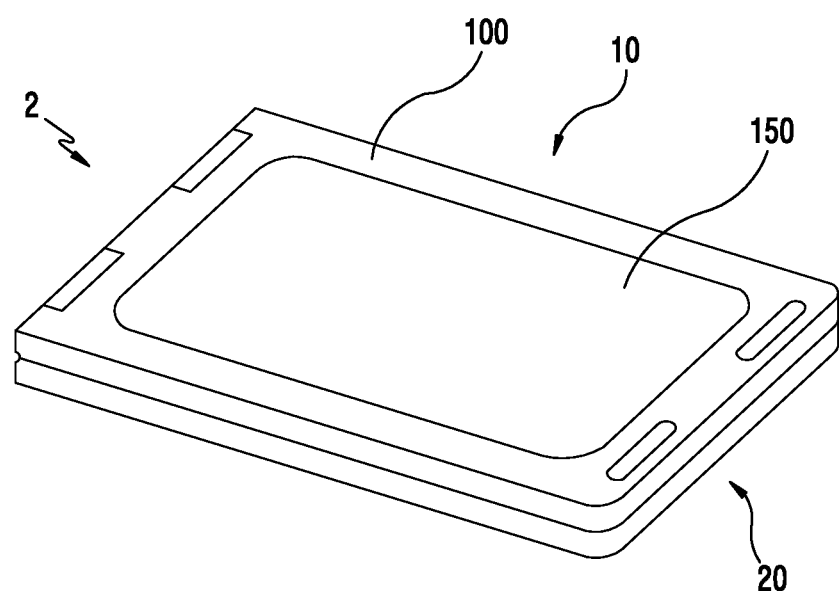
FIG. 5A is a perspective view of the electronic device illustrating the first and second body parts in a folded configuration, according to an embodiment of the present disclosure.
Figure 5B:
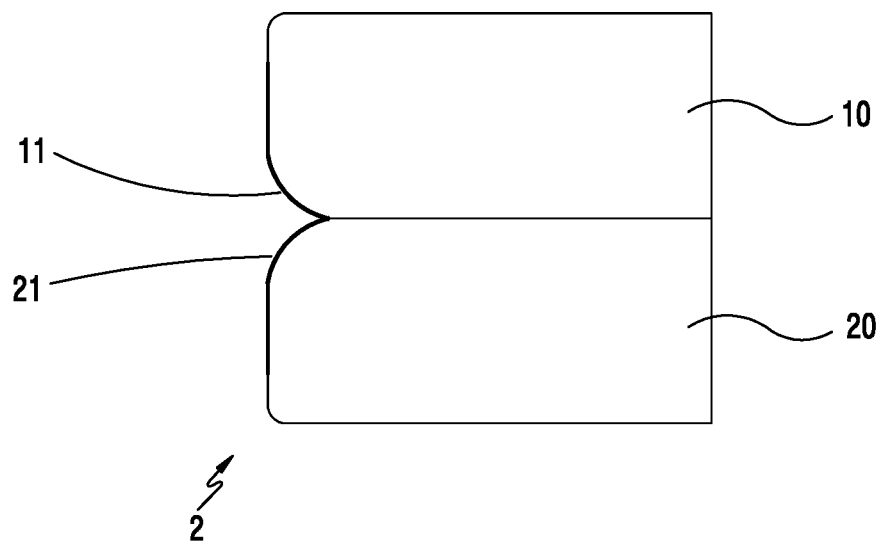
FIG. 5B is a partial, side view of the electronic device illustrating the first and second body parts in the folded configuration, according to an embodiment of the present disclosure.

Referring to FIG. 4, with the first and second body parts 10 and 20 magnetically coupled to each other by the first and second connection members 11 and 21, the first body part 10 and the second body part 20 can be moved from the unfolded configuration to the folded configuration about the first and second coupling surfaces 10b and 20b, respectively, as further illustrated in FIG. 5A and FIG. 5B.

Figure 6:
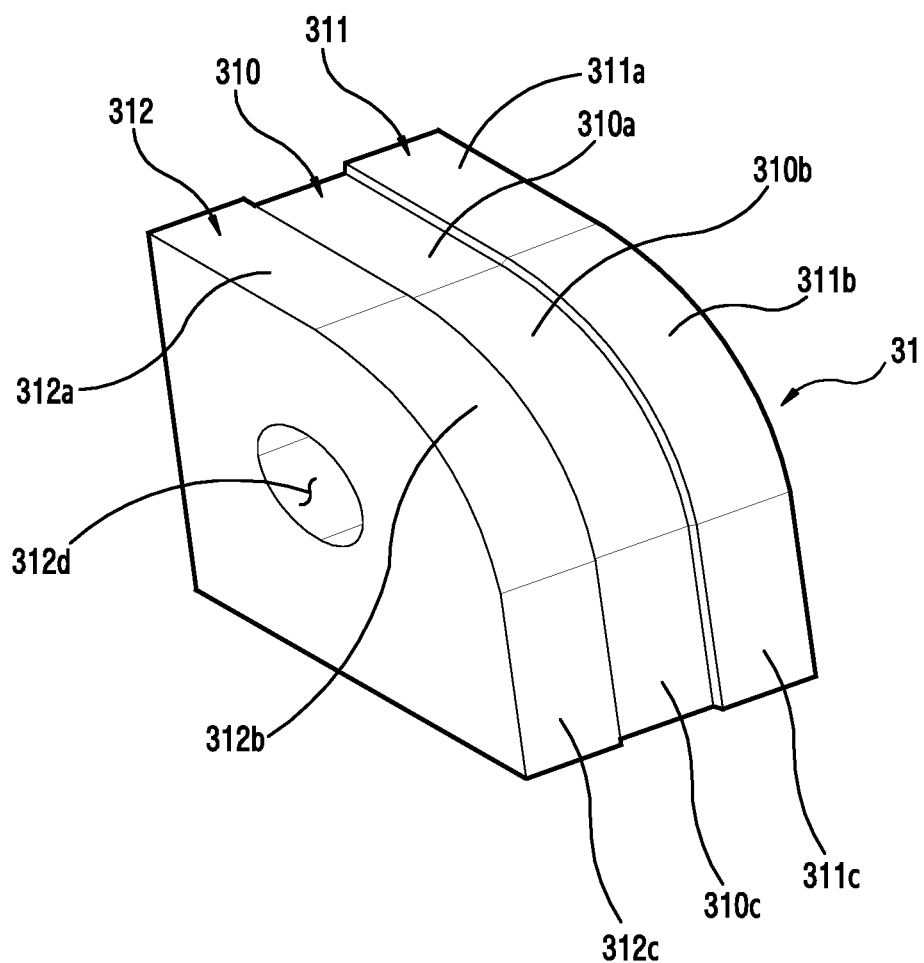
FIG. 6 is a perspective view illustrating a configuration of a first connection member which is employed at the first body part, according to an embodiment of the present disclosure.
Figure 7:
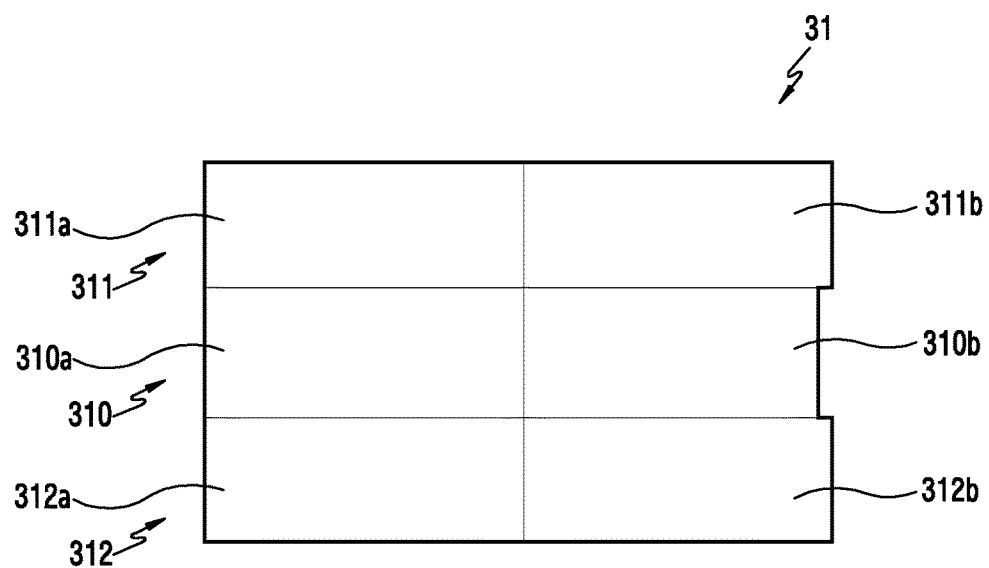
FIG. 7 is a diagram illustrating a configuration of the first connection member, according to an embodiment of the present disclosure.

FIG. 6 is a perspective view illustrating a configuration of a first connection member 31 which is employed at the first body part 10, according to an embodiment of the present disclosure. FIG. 7 is a diagram illustrating a configuration of the first connection member 31, according to an embodiment of the present disclosure.

Referring to FIGS. 6 and 7, the first connection member 31 includes a magnet 310 and first metal bodies 311 and 312 that are arranged on both sides of the magnet 310 and magnetically coupled thereto. As described below, the first metal bodies 311 and 312 may be movably mounted on a shaft 420.

The magnet 310 includes upper and lower planes 310a and 310c (a first flat area), and an outer peripheral surface 310b (a second area including a relatively curved configuration and extending in at least one direction from the first flat area) between the upper and lower planes 310a and 310c.

The first metal bodies 311 and 312 each include upper and lower planes 311a and 311c and upper and lower planes 312a and 312c (a first flat area), respectively and an outer peripheral surface 311b (a second area including a relatively curved configuration and extending in at least one direction from the first area) between the upper and lower planes 311a and 311c and an outer peripheral surface 312b (a second area including a relatively curved configuration and extending in at least one direction from the first area) between the upper and lower planes 312a and 312c, respectively.

The outer peripheral surface 310b of the magnet 310 and the outer peripheral surfaces 311b and 312b of the first metal bodies 311 and 312 have a first curvature. The magnet 310 and the first metal bodies 311 and 312 have a through-hole, through which the shaft 420 passes. FIG. 6 shows only a through-hole 312d formed in the first metal body 312.

Figure 8:
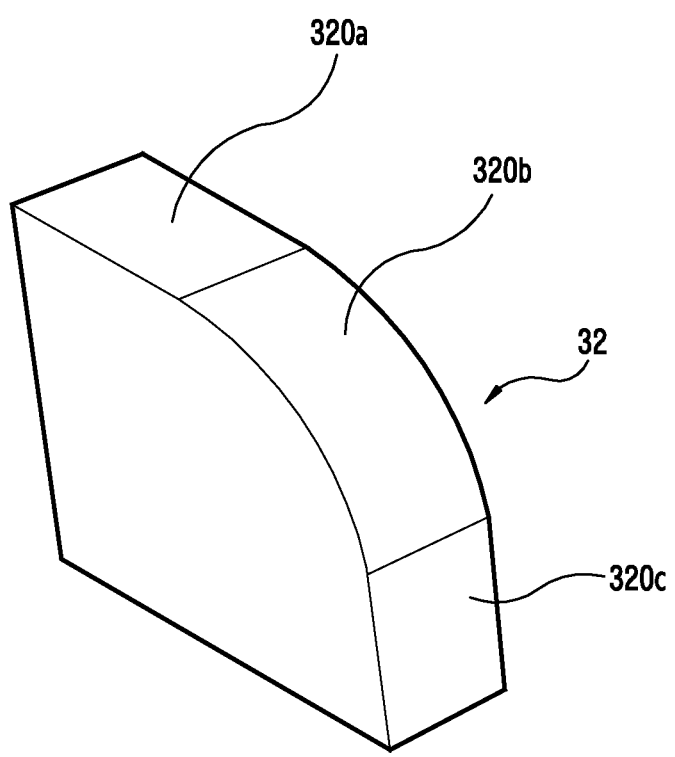
FIG. 8 is a perspective view illustrating a configuration of a second connection member which is employed at the second body part, according to an embodiment of the present disclosure.

FIG. 8 is a perspective view illustrating a configuration of a second connection member 32 which is employed at the second body part 20, according to an embodiment of the present disclosure.

Referring to FIG. 8, the second connection member 32 includes upper and lower planes 320a and 320c, and an outer peripheral surface 320b between the upper and lower planes 320a and 320c. A curvature of the outer peripheral surface 320b may be substantially the same as the first curvature of the outer peripheral surface 310b of the magnet 310 and the outer peripheral surfaces 311b and 312b of the first metal bodies 311 and 312.

Figure 9:
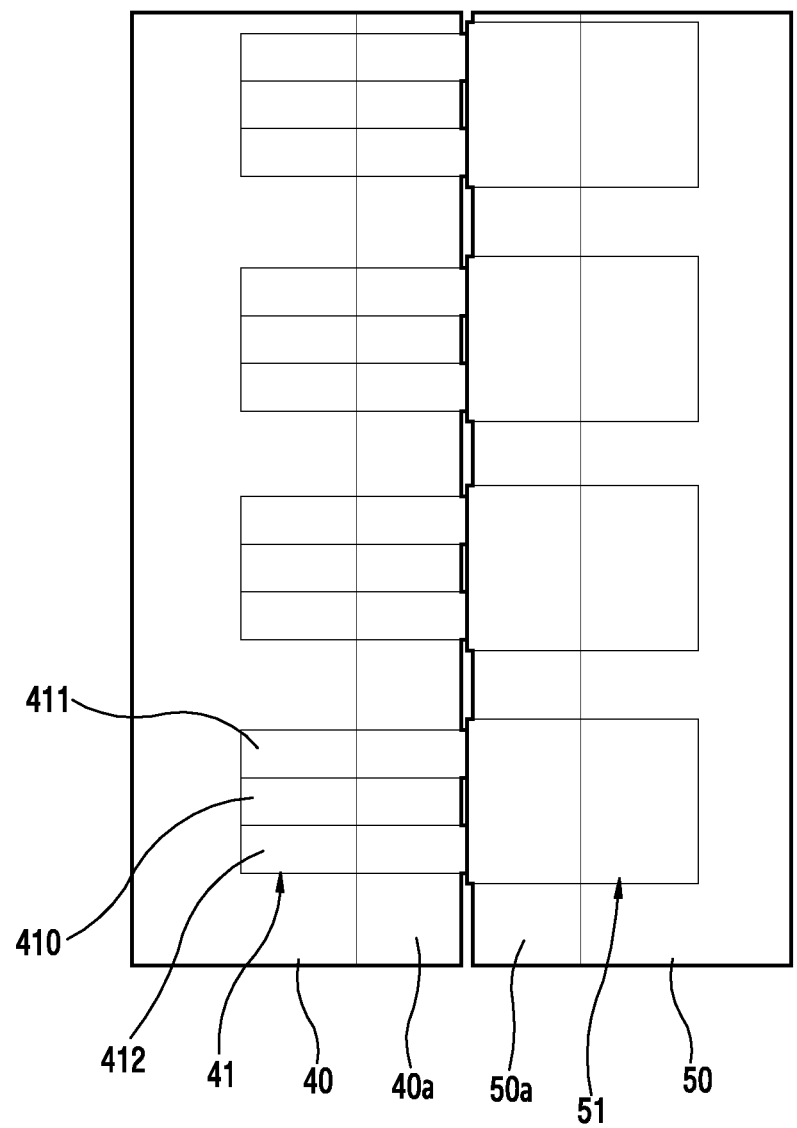
FIG. 9 is a diagram of the electronic device illustrating the first and second body parts magnetically coupled to each other, according to an embodiment of the present disclosure.

FIG. 9 is a diagram of the electronic device 2 illustrating first and second body parts 40, 50 magnetically coupled to each other, according to an embodiment of the present disclosure.

Referring to FIG. 9, first and second connection members 41 and 51, which are used at the first and second body parts 40 and 50, may be mounted on first and second coupling surfaces 40a and 50a, respectively and may be magnetically coupled to each other.

Similar to the first and second connection members 11, 21, four first connection members 41 may be equidistantly arranged side by side at a first upper portion of the first coupling surface 40a, and four second connection members 51 may be equidistantly arranged side by side at a second upper portion of the second coupling surface 50a. Likewise, four first connection members 41 may be equidistantly arranged side by side at a first lower portion of the coupling surface 40a, and four second connection members 51 may be equidistantly arranged side by side at a second lower portion of the coupling surface 50a.

The first and second connection members 41 and 51 allow the first and second body parts 40 and 50 to be moved between the folded configuration and the unfolded configuration while the first and second coupling surfaces 40a and 50a are in contact with each other, i.e., the first and second connection members 41 and 51 would be magnetically coupled to each other.

The first connection member 41 may have one magnet 410 including two first metal bodies 411 and 412 that are configured to contact the second connection member 51.

Figure 11:
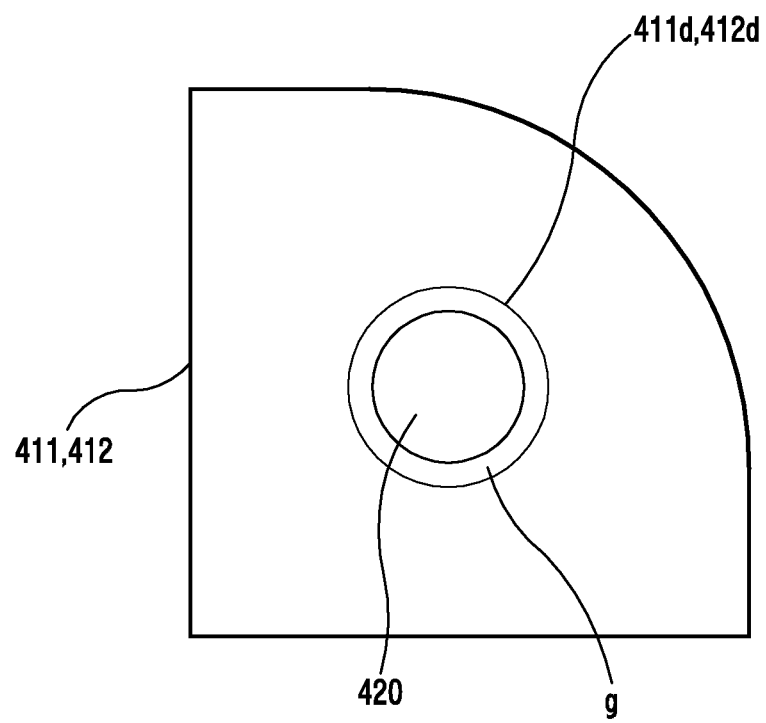
FIG. 11 is a side view illustrating a gap between the shaft and a first metal body, according to an embodiment of the present disclosure.

In certain embodiments, it may prove advantageous for each of the first metal bodies 411 and 412 to have an aperture with a diameter that is larger than a diameter of an aperture of the magnet 410 so that a slight gap "g" is provided between the first metal bodies 411 and 412 and the shaft 420 (see FIG. 11).

The first metal bodies 411 and 412 may shield both surfaces of the magnet 410, thereby preventing or diminishing the effects of magnetic leakage of the magnet 410, which can adversely affect the electronic device 2.

Figure 10:
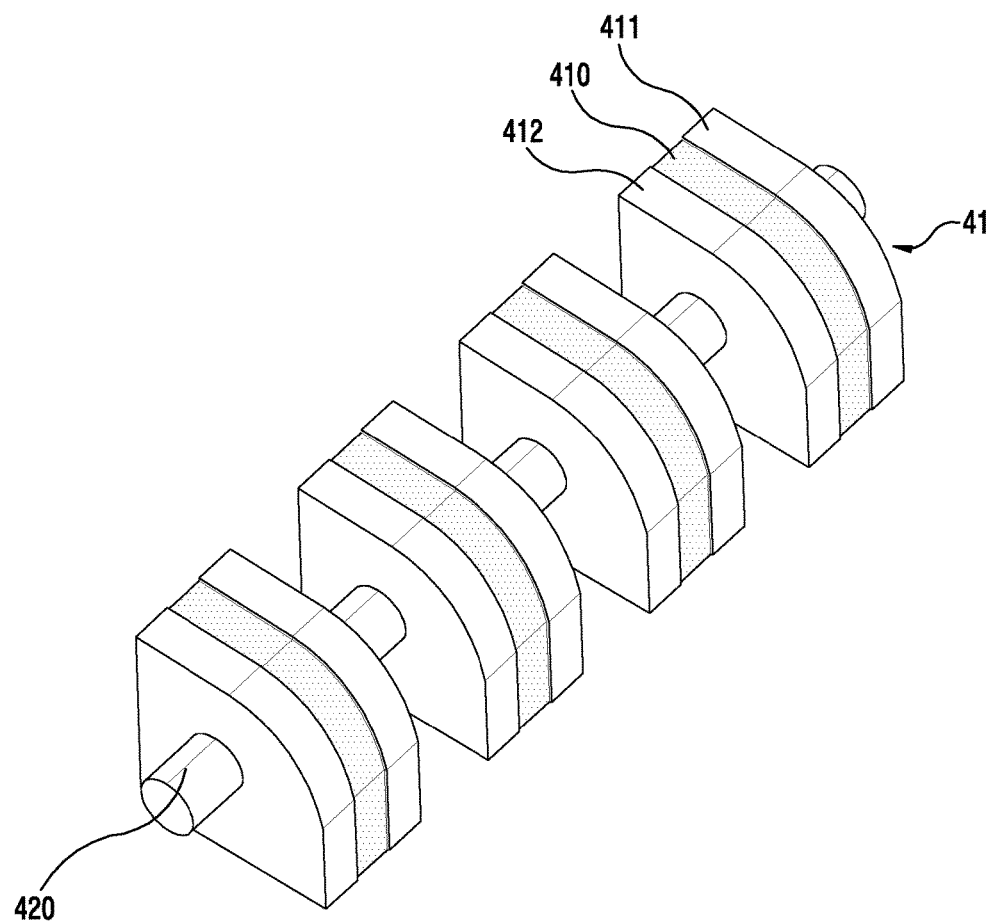
FIG. 10 is a perspective view illustrating four first connection members mounted on a shaft of the first body part, according to an embodiment of the present disclosure.

FIG. 10 is a perspective view illustrating four first connection members 41 mounted on the shaft 420 of the first body part 40, according to an embodiment of the present disclosure. FIG. 11 is a side view illustrating the gap "g" between the shaft 420 and the first metal body 411, according to an embodiment of the present disclosure.

Referring to FIGS. 10 and 11, four first connection members 41 may be coupled to the shaft 420 and mounted at the upper and lower sides of the first body part 40. The one first connection member 41 may include the magnet 410 and the pair of first metal bodies 411 and 412 arranged on both side surfaces of the magnet 410. Each of the first metal bodies 411 and 412 may in face-to-face contact with both side surfaces of the magnet 410 and magnetically coupled thereto.

The magnet 410 fixedly attached to the shaft 420 and each of the first metal bodies 411 and 412 may be movably mounted to the shaft 420, as a result of the gap "g" between the outer peripheral surface of the shaft 420 and each of shaft through-holes 411d and 412d included in first metal bodies 411 and 412. That is, the outer diameter of the through-holes 411d and 412d may be larger than the outer diameter of the shaft 420, so that the first metal bodies 411 and 412 may move relative to the shaft 420. Such a configuration allows the first metal bodies 411 and 412 to be quickly and stably connected to corresponding metal bodies of the second connection member 51. One of the first metal bodies 411 and 412 may be, more stably and quickly, magnetically coupled to metal bodies of the second connection member 51 by the nature of magnetic force which is concentrated on the end part of each of the first metal bodies 411 and 412 and second metal bodies (the end part of each of the first metal bodies 411 and 412 and second metal bodies has a high magnetic flux density).

Figure 12A:
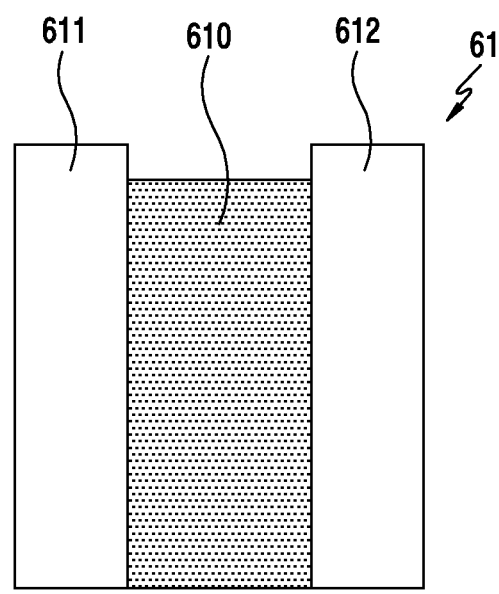
FIG. 12A is a diagram illustrating the first connection member, according to an embodiment of the present disclosure.

FIG. 12A is a diagram illustrating a first connection member 61, according to an embodiment of the present disclosure.

Referring to FIG. 12A, the first connection member 61 includes a magnet 610 and a pair of first metal bodies 611 and 612 arranged on both side surfaces of the magnet 610. The magnet 610 may have a slightly smaller size than the first metal bodies 611 and 612. That is, the magnet 610 and of the first metal bodies 611 and 612 may have a stepped configuration.

Figure 12B:
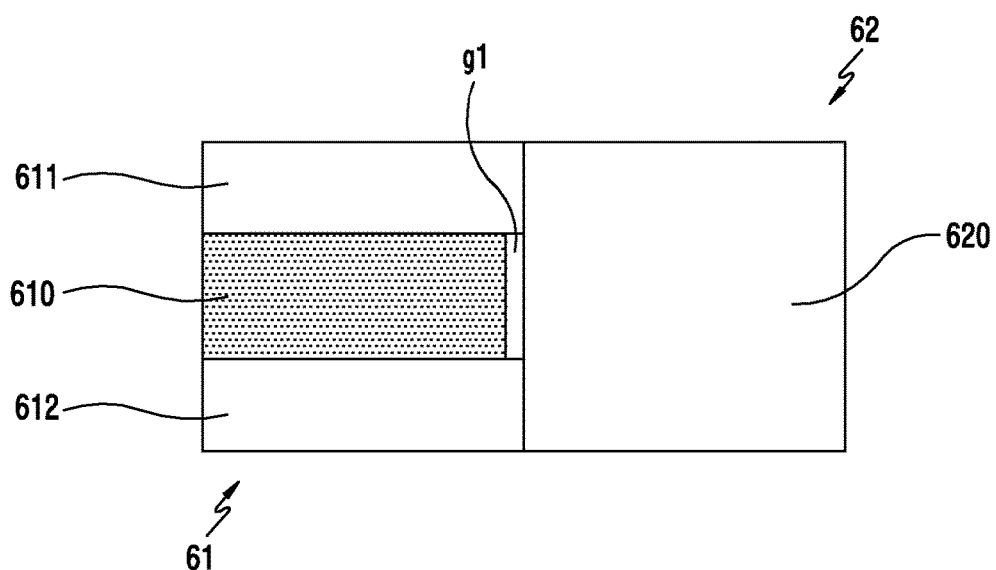
FIG. 12B is a diagram illustrating magnetically coupled first and second connection members, according to an embodiment of the present disclosure.

FIG. 12B is a diagram illustrating magnetically coupled first and second connection members 61 and 62, respectively, according to an embodiment of the present disclosure.

Referring to FIG. 12B, when the first connection member 61 is magnetically coupled to the second connection member 62, a gap "g1" is provided between an outer surface of the magnet 610 and an outer surface of a metal body 620 of the second connection member 62; this gap "g1" is a result of the size difference between the magnet 610 and the first metal bodies 611 and 612. It is noted, as the first and second connection members 61 and 62 are always exposed to the outside, and thus may always have foreign substances sticking thereto, the first and second connection members 61 and 62 may not be smoothly coupled due to the foreign substances. By providing a space for the foreign substances, e.g., a gap "g1", the first and second connections 61 and 62 may be, more stably, magnetically coupled to each other.

Figure 13:
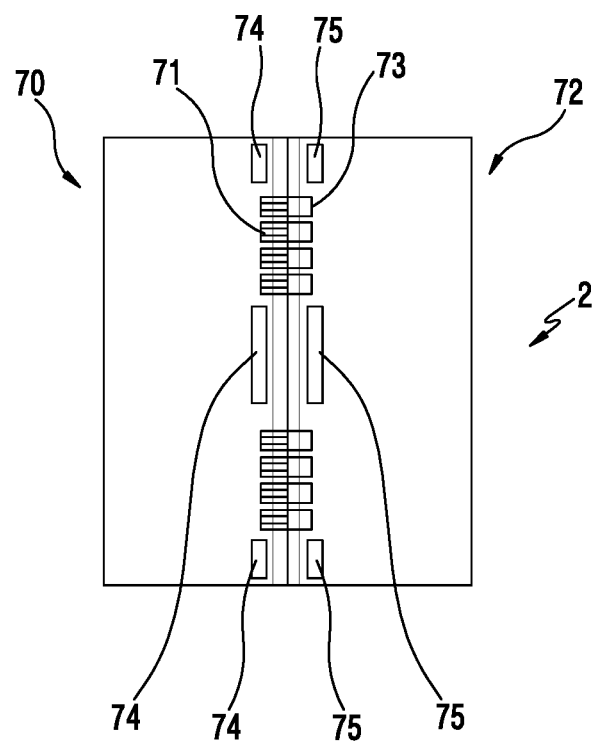
FIG. 13 is a diagram illustrating the electronic device in an unfolded configuration with the first and second body parts magnetically coupled to each other, according to an embodiment of the present disclosure.

FIG. 13 is a diagram illustrating the electronic device 2 in an unfolded configuration with the first and second body parts 70, 72, respectively, magnetically coupled to each other, according to an embodiment of the present disclosure.

Referring to FIG. 13, the electronic device 2 may include holding devices 74 and 75 for holding a coupling location when the first and second housing parts 70 and 72 are magnetically coupled by first and second connection members 71 and 73. The holding devices 74 and 75 may be implemented using magnets having different polarities. The holding devices 74 and 75, which hold the coupling location of the first and second housing parts 70 and 72, may include at least one first magnet 74 arranged at the first housing part 70 and at least one second magnet 75 arranged at the second housing part 72. The first magnet 74 has a first polarity, and a plurality of first magnets 74 may be arranged along a first coupling surface of the first housing part 70. One of the first magnets 74 may be arranged between the first connection members 71. The second magnet 75 has a second polarity opposite to the first polarity, and a plurality of second magnets 75 may be arranged along a second coupling surface of the second housing part 72. The second magnets 75 may be arranged between the second connection members 73. Each of the first magnets 74 and each of the second magnets 75 may be arranged at a position opposite to each other within a predetermined distance. When the first and second magnets 74 and 75 are magnetically coupled, the first connection member 71 and the second connection member 73 may be magnetically coupled to each other, thereby maintaining the electronic device in a folded configuration.

The aforementioned connection members enable easy coupling and separation of the first and second body parts, and may increase an aesthetic sense of appearance.

While the present disclosure has been shown and described with reference to certain embodiments thereof, it will be understood by those skilled in the art that various changes in form and details may be made therein without departing from the scope of the present disclosure. Therefore, the scope of the present disclosure should not be defined as being limited to the embodiments, but should be defined by the appended claims and equivalents thereof.

What is claimed is:

1. An electronic device comprising:
a first body part including a first connection member; and
a second body part including a second connection member,
wherein at least one of the first connection member and the second connection member includes a portion having a first flat area and a second area, the second area having a generally curved configuration and extending from the first flat area for magnetically coupling the first body part and the second body part to each other, and
wherein the first connection member comprises:
a shaft disposed on the first body part along a center of a first curvature;
a magnet extending through the shaft; and
first and second metal bodies extending over the shaft and that are magnetically coupled to the magnet.

2. The device of claim 1, wherein the first connection member and the second connection member are coupled to each other in a non-insertion type manner.

3. The device of claim 1, wherein the first connection member and the second connection member are coupled to each other in a face-to-face contact type manner.

4. The device of claim 1, wherein the first connection member is made from magnet material and the second connection member is made from a metal.

5. The device of claim 1, wherein with the first body part and the second body part magnetically coupled to each other, the first body part and second body part are moveable relative to each other between a folded configuration and an unfolded configuration.

6. The device of claim 1, wherein a first coupling surface having the first curvature is formed in a first coupling portion of the first body part and a second coupling surface having the first curvature is formed in a second coupling portion of the second body part.

7. The device of claim 6, wherein a third coupling surface having the first curvature is formed in a third coupling portion of the first body part and a fourth coupling surface having the first curvature is formed in a fourth coupling portion of the second body part.

8. The device of claim 7, wherein the first and third coupling surfaces have substantially the same coupling surface configurations and the second and forth coupling surfaces have substantially the same coupling surface configurations.

9. The device of claim 1, wherein the first connection member comprises:
a magnet; and
a first metal body attached to at least one side of the magnet.

10. The device of claim 6, wherein the first connection member is defined by at least four connection members that are equidistantly spaced apart from each other and arranged at an upper portion and a lower portion of the first coupling surface of the first body part.

11. The device of claim 10, wherein the second connection member comprises a second metal body.

12. The device of claim 11, wherein the second connection member is defined by four connection members that are spaced apart from each other and a pair of second connection members are arranged on the second coupling surface of the second body part.

13. The device of claim 1, wherein an inner diameter of a through-hole of the first and second metal bodies is larger than an outer diameter of the shaft, so that the first and second metal bodies can be moved on the shaft.

14. The device of claim 13, wherein an outer peripheral surface of the magnet and outer peripheral surfaces of the first and second metal bodies extend along different planes.

15. The device of claim 14, wherein the outer peripheral surface of the magnet and the outer peripheral surfaces of the first and second metal bodies form a stepped configuration.

16. The device of claim 1, further comprising a holding device for maintaining the first and second body parts in a folded configuration.

17. The device of claim 16, wherein the magnet holding device comprises:
a first magnet arranged on the first body part; and
a second magnet arranged on the second housing part and having a polarity that is opposite a polarity of the first magnet,
wherein the first magnet is arranged along a coupling surface of the first body part and the second magnet is arranged along a coupling surface of the second housing part.

18. The device of claim 16, wherein the first body part and the second body part form a housing of the electronic device.

* * * * *